United States Patent
Liu et al.

(10) Patent No.: US 10,598,477 B2
(45) Date of Patent: Mar. 24, 2020

(54) DYNAMIC DETERMINATION OF METAL FILM THICKNESS FROM SHEET RESISTANCE AND TCR VALUE

(71) Applicant: KLA—TENCOR CORPORATION, Milpitas, CA (US)

(72) Inventors: Xianghua Liu, Shanghai (CN); Walter Johnson, Rocklin, CA (US); Jianli Cui, Shanghai (CN); Lu Yu, Shanghai (CN); Nanchang Zhu, Shanghai (CN); Juli Cheng, Zhubei (TW); Huanglin Li, Shanghai (CN); Liming Liu, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 60 days.

(21) Appl. No.: 15/421,695

(22) Filed: Feb. 1, 2017

(65) Prior Publication Data
US 2017/0227347 A1   Aug. 10, 2017

Related U.S. Application Data

(60) Provisional application No. 62/291,092, filed on Feb. 4, 2016.

(51) Int. Cl.
   *G01B 7/06*   (2006.01)
   *G01R 31/28*  (2006.01)
   *G01R 27/00*  (2006.01)

(52) U.S. Cl.
   CPC .......... *G01B 7/06* (2013.01); *G01R 31/2831* (2013.01); *G01R 27/00* (2013.01)

(58) Field of Classification Search
   CPC .... G01N 27/041; G01R 27/00; G01R 31/311; G01R 31/2831; G01B 7/06; H01L 22/12; A61N 1/02
   See application file for complete search history.

(56) References Cited

U.S. PATENT DOCUMENTS

| | | | |
|---|---|---|---|
| 4,443,278 A | 4/1984 | Zingher | |
| 4,703,252 A * | 10/1987 | Perloff | G01R 27/02 324/719 |
| 5,184,398 A | 2/1993 | Moslehi | |
| 5,260,668 A | 11/1993 | Mallory et al. | |
| 7,005,306 B1 | 2/2006 | Poris | |

(Continued)

FOREIGN PATENT DOCUMENTS

WO   2004042791   5/2004

OTHER PUBLICATIONS

ISA/KR, International Search Report for PCT/US2017/016265 dated May 12, 2017.

(Continued)

*Primary Examiner* — Bryan Bui
(74) *Attorney, Agent, or Firm* — Hodgson Russ LLP

(57) ABSTRACT

Metal film thickness can be determined using the sheet resistance, resistivity, and temperature coefficient of resistivity for the metal film. Variation in film thickness measurements caused by resistivity can be reduced or eliminated. A probe head may be used for some of the measurements of the metal film. The probe head can include a temperature sensor used during sheet resistance measurements. A wafer on a chuck is heated, such as using the chuck or the probe head, for the measurements.

6 Claims, 12 Drawing Sheets

(56) References Cited

U.S. PATENT DOCUMENTS

| | | | |
|---|---|---|---|
| 8,502,639 B1 | 8/2013 | Coffey et al. | |
| 2004/0119978 A1* | 6/2004 | Borden | G01N 21/1717 |
| | | | 356/432 |
| 2006/0199354 A1* | 9/2006 | Gu | B23K 26/0673 |
| | | | 438/460 |
| 2008/0230357 A1 | 9/2008 | Vinci et al. | |
| 2014/0162130 A1* | 6/2014 | Barsoum | C01B 21/06 |
| | | | 429/231.8 |
| 2015/0204490 A1 | 7/2015 | Zheng et al. | |
| 2016/0320430 A1 | 11/2016 | Zhu et al. | |

OTHER PUBLICATIONS

Sondheimer, The Mean Free Path of Electrons in Metals, Advances in Physics, vol. 1, No. 1, 42 pages Jan. 1, 1952.

Fuchs, The conductivity of thin metallic films according to the electron theory of metals, Mathematical Proceedings of the Cambridge Philosophical Society, vol. 34, No. 1, pp. 100-108 Jan. 1, 1938.

Mayadas, et al., Electrical-Resistivity Model for Polycrystalline Films: the Case of Arbitrary Reflection at External Surfaces, Physical Review 6, vol. 1, No. 4, pp. 1382-1389 Feb. 15, 1970.

Jiang, et al., Electroplated Cu Recrystallization in Damascene Structures at Elevated Temperatures, Mat. Res. Soc. Symp. Proc., vol. 564, pp. 429-434 Jan. 1, 1999.

* cited by examiner

DYNAMIC DETERMINATION OF METAL FILM THICKNESS FROM SHEET RESISTANCE AND TCR VALUE

CROSS-REFERENCE TO RELATED APPLICATIONS

This application claims priority to the provisional patent application filed Feb. 4, 2016 and assigned U.S. App. No. 62/291,092, the disclosure of which is hereby incorporated by reference.

FIELD OF THE DISCLOSURE

This disclosure relates to determining metal film thickness.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

In a semiconductor fabrication facility (fab), metal film quality can be monitored by a sheet resistance (Rs) measurement tool. Both film resistivity ($\rho$) and thickness (THK) information are represented by the Rs value according to the formula Rs=$\rho$/THK. However, process engineers still need the separate value for film thickness and/or resistivity for some cases. For example, during chemical mechanical planarization (CMP) steps, film thickness is needed for CMP rate estimation. When the copper film is polished to a different thickness, its resistivity will change due to a surface scattering effect. If a constant resistivity value is used to calculate the film thickness, the calculated thickness will deviate from the real value, which causes an inaccurate estimation of CMP rate. Besides the thickness effect, grain size variation of copper electrochemical plating (ECP) conditions, like growth temperature or plating rate, also may change the resistivity, which makes thickness estimation directly from Rs value even more difficult.

Metal self-annealing is another example with difficult Rs measurements. Grains in a metal film tend to grow after the metal film is deposited on a substrate, which reduces its resistivity over time. This gradual Rs trend with time adds uncertainty in process control.

Usually resistivity is calculated from Rs and film thickness. Several techniques have been used to measure metal film thickness directly in a semiconductor fabrication facility (fab). These techniques include TEM/SEM, XRD/XRF, profiler tools, spectroscopic ellipsometry (SE) tools, and optical-acoustic techniques.

For TEM/SEM, a wafer needs to be broken into small pieces. Then a cross-section image can be obtained at the edge of test piece. TEM/SEM equipment can be expensive and sample preparation time is long. Furthermore, this kind of measurement cannot be used as a routine fab metrology method because it is slow and destructive.

For XRD/XRF, the metal film thickness can be determined by scattering strength, interference fringes, fringe spacing and scattering strength, profile simulation, and other methods. All methods are based on modeling and fitting. Assumptions, simplifications, and reference standards are used for these methods because x-ray signals are related to material properties of a film and/or substrate, such as composition, crystal structure, texture, strain/stress, defects, and/or surface oxide/roughness. This limits XRD measurement applications. XRD/XRF methods also have low throughput, which may be insufficient in a fab. Several expensive XRD/XRF tools may be necessary for signal collecting on a single site.

For a profiler tool, the film thickness is obtained by removing part of a film that was grown on a wafer, which forms a step at the edge of film covered and uncovered regions. A diamond micro pin scans across the edge and the height values are measured. The film thickness is reported as a height difference between a region covered by a film and a region not covered by the film. Extra processes like lithography and etching are needed to provide the two regions, which adds time and expense. Furthermore, the profiler may only be capable of detecting height differences greater than 1 nm.

SE is used for dielectric film thickness characterization with optical modeling of parameters including n, k, and film thickness. However, the penetration depth of light, even at the infrared range, is small for a metal film due to the high conductivity of such metal films. As a result, the film thickness measureable range is limited and correlated to metal conductivity. Typically the maximum film thickness is several nanometers. In an instance, the maximum film thickness is <2 nm. These limitations make SE inappropriate for many measurements in a fab.

An optical-acoustic method can report metal film thickness. For example, a femtosecond-laser can achieve a fine spatial resolution down to scale of nanometers. The laser pulse frequency range can be from 0.1 to 1 THz. When the femtosecond-laser is incident on the metal film on the wafer surface, the surface is heated and generates an elastic wave propagating toward the wafer. When the wave propagates through an interface between the metal film and the wafer, waves reflect and return to the wafer surface, which causes a deformation at the wafer surface. Another probing laser monitors the surface deformation (reflectance signal) with time. The film thickness is obtained by fitting the time-resolved reflectance signal. The time interval between two reflectance peaks is determined from the fitting curve. The film thickness can be calculated from the speed of sound. The speed of sound inside the metal is set as a constant from a reference or calibration. Optical-acoustic techniques have shortcomings that make it inadequate in a fab. First, it has a poor typical stability (1sigma:0.5%) as compared to other methods. Second, there is an error source from the assumption of constant speed of sound. The speed of sound is related to material properties (e.g., density, bulk modulus, and Poisson's ratio). These properties may change with different process conditions. For example, metal grain size will change the modulus. Sometime 5% error can occur when Co thickness is measured, which is not acceptable for fab process control. Third, the film thickness may only be accurate from 40 A to 8 μm.

Therefore, improved methods and systems to measure film thickness are needed.

BRIEF SUMMARY OF THE DISCLOSURE

In a first embodiment, a method is provided. The method comprises receiving, at a controller, a sheet resistance and a temperature coefficient of resistivity of a film on a wafer. Using the controller, a resistivity of the film is determined based on the temperature coefficient of resistivity of the film using a correlation between the resistivity of the film and the temperature coefficient of resistivity of the film. Using the controller, a thickness of the film is determined with the equation THK=(1/Rs)(γ/TCR), wherein THK is a thickness, Rs is sheet resistance, γ is the resistivity, and TCR is temperature coefficient of resistivity. The correlation between the resistivity of the film and the temperature coefficient of resistivity of the film may be linear or non-linear. The thickness divided by the mean free path can be greater than 10.

In a second embodiment, a non-transitory computer-readable storage medium is provided. The non-transitory computer-readable storage comprises one or more programs for executing the following steps on one or more computing devices. A sheet resistance and a temperature coefficient of resistivity of a film on a wafer is received. A resistivity of the film is determined based on the temperature coefficient of resistivity of the film using a correlation between the resistivity of the film and the temperature coefficient of resistivity of the film. A thickness of the film is determined with the equation THK=(1/Rs)(γ/TCR), wherein THK is a thickness, Rs is sheet resistance, y is the resistivity, and TCR is temperature coefficient of resistivity. The correlation between the resistivity of the film and the temperature coefficient of resistivity of the film may be linear or non-linear. The thickness divided by the mean free path can be greater than 10.

In a third embodiment, a system is provided. The system comprises a probe head that includes a plurality of stop pads; at least four probes configured to measure sheet resistance of a wafer; and a temperature sensor disposed on the probe head. The temperature sensor is configured to measure a temperature of a wafer surface during a sheet resistance measurement.

The system can further comprise a chuck configured to hold the wafer and a heating element configured to heat the chuck.

The system can further comprise an actuator connected to the probe head. The actuator is configured to move the probe head relative to the wafer.

The probe head can include a heat source disposed on the probe head. The heat source may be a flash lamp or a laser. The system can further comprise a chuck configured to hold the wafer. The chuck can include a cooling element configured to cool at least part of a surface of the chuck.

In an instance, the probe head includes at least twelve of the probes. The probes are whiskers of a material coated with a metal. For example, the material may be silicon, silicon oxide, or a combination thereof. The probes are each spaced apart from less than 1 μm to 1 mm.

The temperature sensor may be disposed on one of the stop pads. The temperature sensor can be configured to contact a wafer surface during a sheet resistance measurement The system can further comprise a controller in electronic communication with the probe head. The controller can include a processor and an electronic data storage unit in electronic communication with the processor. The controller may be configured to: receive a sheet resistance and a temperature coefficient of resistivity of a film on a wafer from the probe head; determine a resistivity of the film based on the temperature coefficient of resistivity of the film using a correlation between the resistivity of the film and the temperature coefficient of resistivity of the film; and determine a thickness of the film with the equation THK=(1/Rs) (γ/TCR), wherein THK is a thickness, Rs is sheet resistance, γ is the resistivity, and TCR is temperature coefficient of resistivity.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Measurement of metal film thickness is disclosed. An electrical measurement method can separate thickness and resistivity from Rs measurement. Compared to previous techniques, the embodiments disclosed herein are faster, lower cost, and do not require special sample preparation. Resistivity and film thickness values can be determined, which can be used for process control in the semiconductor industry. The techniques and systems disclosed herein are fast enough to operate in a fab. Variation in film thickness measurements caused by resistivity can be reduced or eliminated.

Film thickness and grain size are two factors that can affect metal film resistivity. This is shown in, for example, the Fuchs and Sondheimer's model. Thickness can be predicted based on electrical resistivity or conductivity, as well as the thickness dependent temperature coefficient of resistivity (TCR) using models. Conductivity is the inverse of resistivity.

Figure 1:
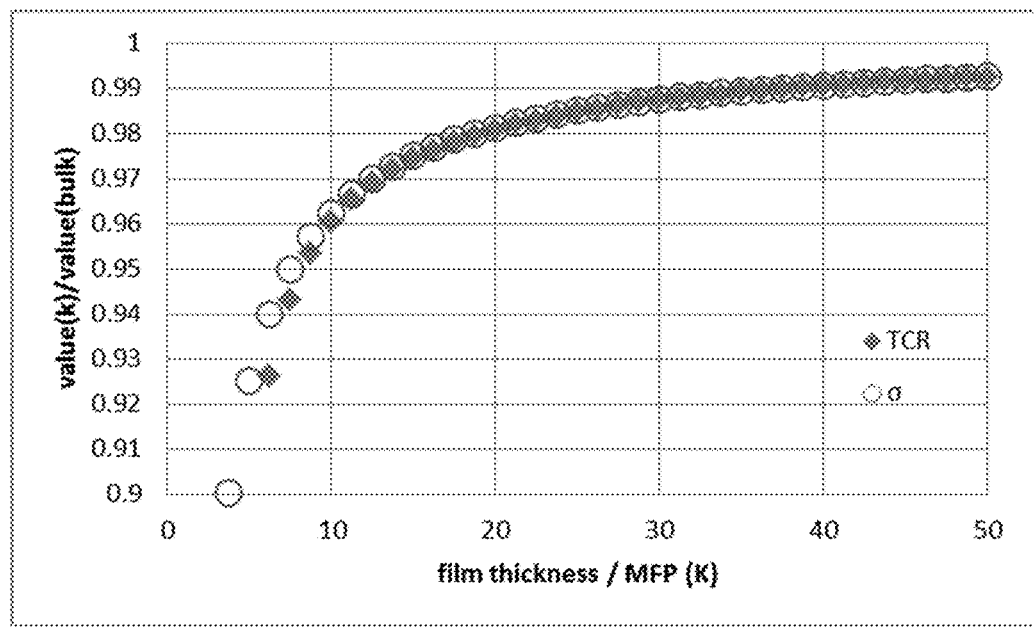
FIG. 1 is a chart showing film thickness effects on σ and TCR by the Mayadas and Shatzkes's model by plotting σ/σ$_0$(TCR/TCR$_0$) versus THK/MFP.
Figure 2:
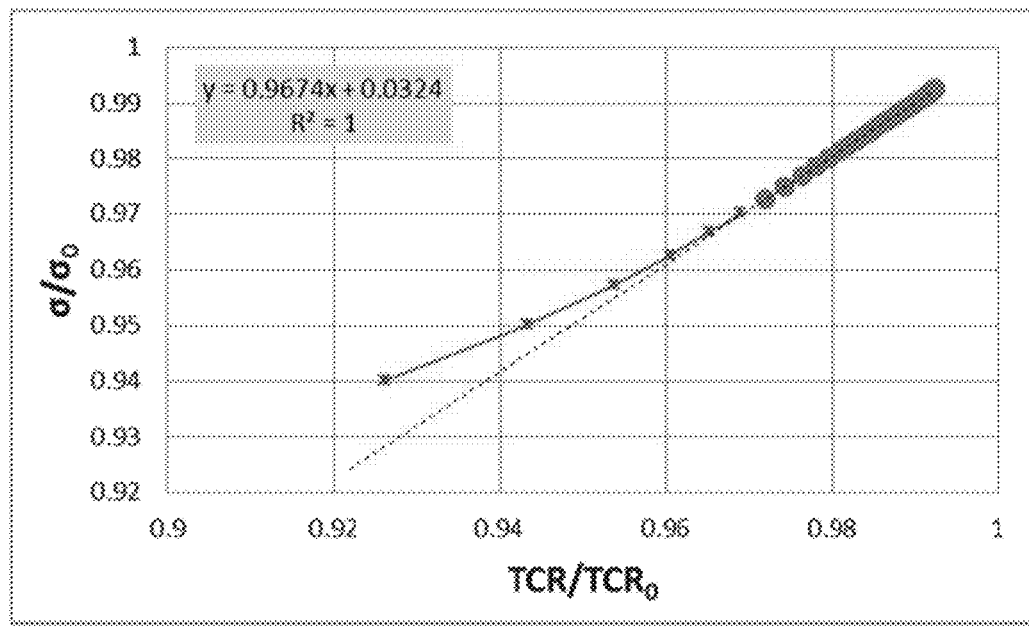
FIG. 2 is a chart showing film thickness effects on σ and TCR by the Mayadas and Shatzkes's model by plotting a correlation between σ and TCR.

Thickness and conductivity ($\sigma$) or TCR are plotted together and a correlation between $\sigma$ and TCR is shown in FIGS. 1 and 2. As seen in FIG. 1, the ratio of the value k and bulk value for TCR and $\sigma$ increase with thickness over the mean free path (MFP) at k. k is the film thickness divided by MFP.

In FIG. 2, $\sigma$ and TCR change simultaneously in accordance with the film thickness variation. For thicker film region (e.g., film thickness/MFP>10), $\sigma/\sigma_0$ is almost linearly dependent on TCR/$TCR_0$. The various data points represent film thickness effects.

Figure 3:
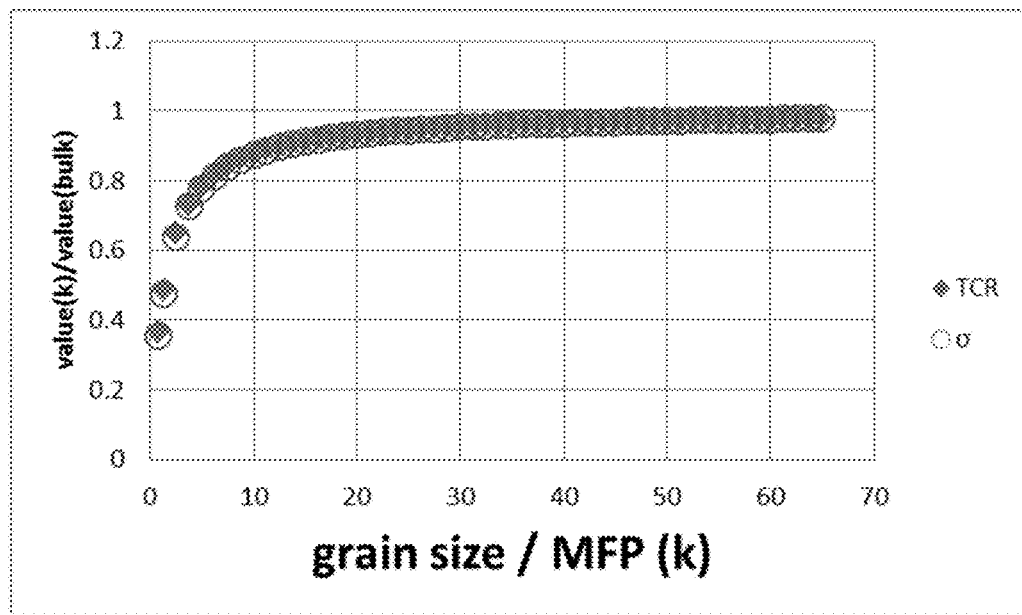
FIG. 3 is a chart showing grain size effects on σ and TCR by the Fuchs and Sondheimer's model by plotting σ/σ$_0$ (TCR/TCR$_0$) versus grain size/MFP.
Figure 4:
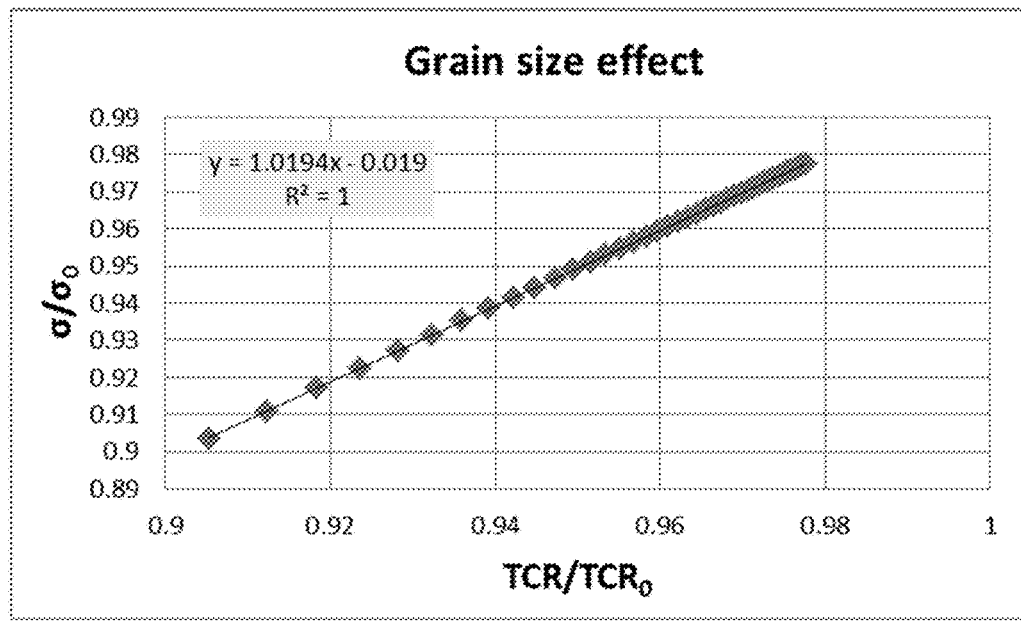
FIG. 4 is a chart showing grain size effects on σ and TCR by the Fuchs and Sondheimer's model by plotting correlation between σ and TCR.

Grain size effects on resistivity and TCR can be calculated. For example, the Mayadas and Shatzkes's model enables calculation of grain size effects. Results using the Mayadas and Shatzkes's model are plotted in FIGS. 3 and 4.

Figure 5:
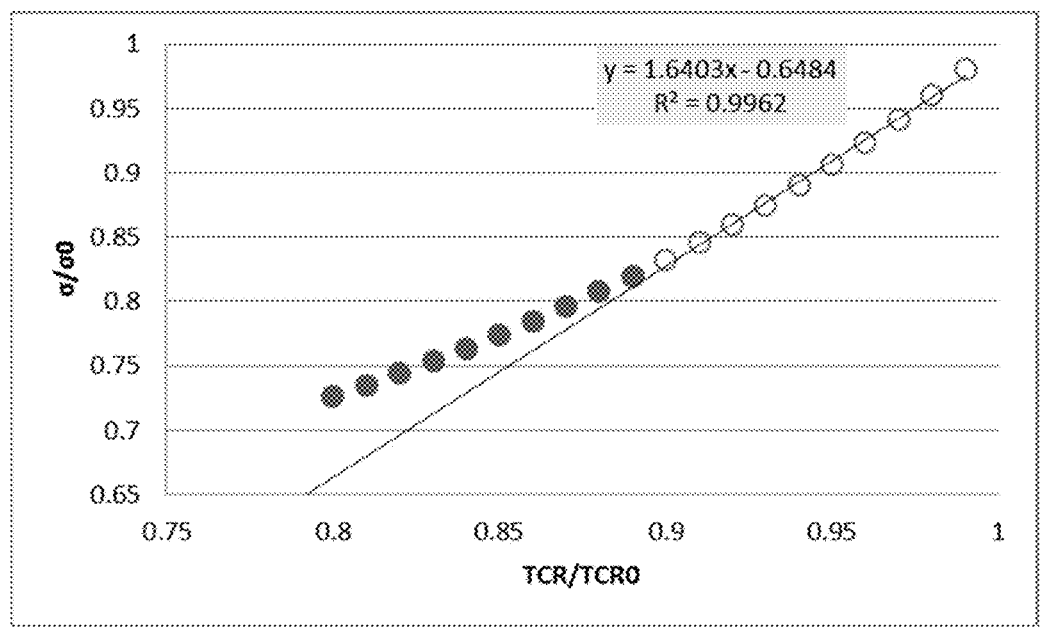
FIG. 5 is a chart showing an overall correlation between TCR and σ for a metal film.

Similar to the thickness effect, $\sigma/\sigma_0$ also is linearly dependent on TCR/$TCR_0$ for grain size effect. $\sigma_0$ and $TCR_0$ are bulk metal conductivity and bulk metal TCR, respectively. If the film thickness and grain size are considered as main effects for determining the metal film resistivity, an overall correlation between TCR and $\sigma$ is shown in FIG. 5. For thick film regions, a linear dependence of TCR over $\sigma$ is observed. Furthermore, the correlation curve is linear for thick metal.

A linear correlation between conductivity and TCR results in the following equation, where thickness is THK, $\gamma$ is the resistivity, and $\rho$ is film resistivity, and $\sigma$ is conductivity.

$$THK = \frac{\rho}{Rs} = \frac{1}{Rs \times \sigma} = \frac{1}{Rs \times \gamma' \times TCR} = \left(\frac{1}{Rs}\right)\left(\frac{\gamma}{TCR}\right)$$

Figure 6:
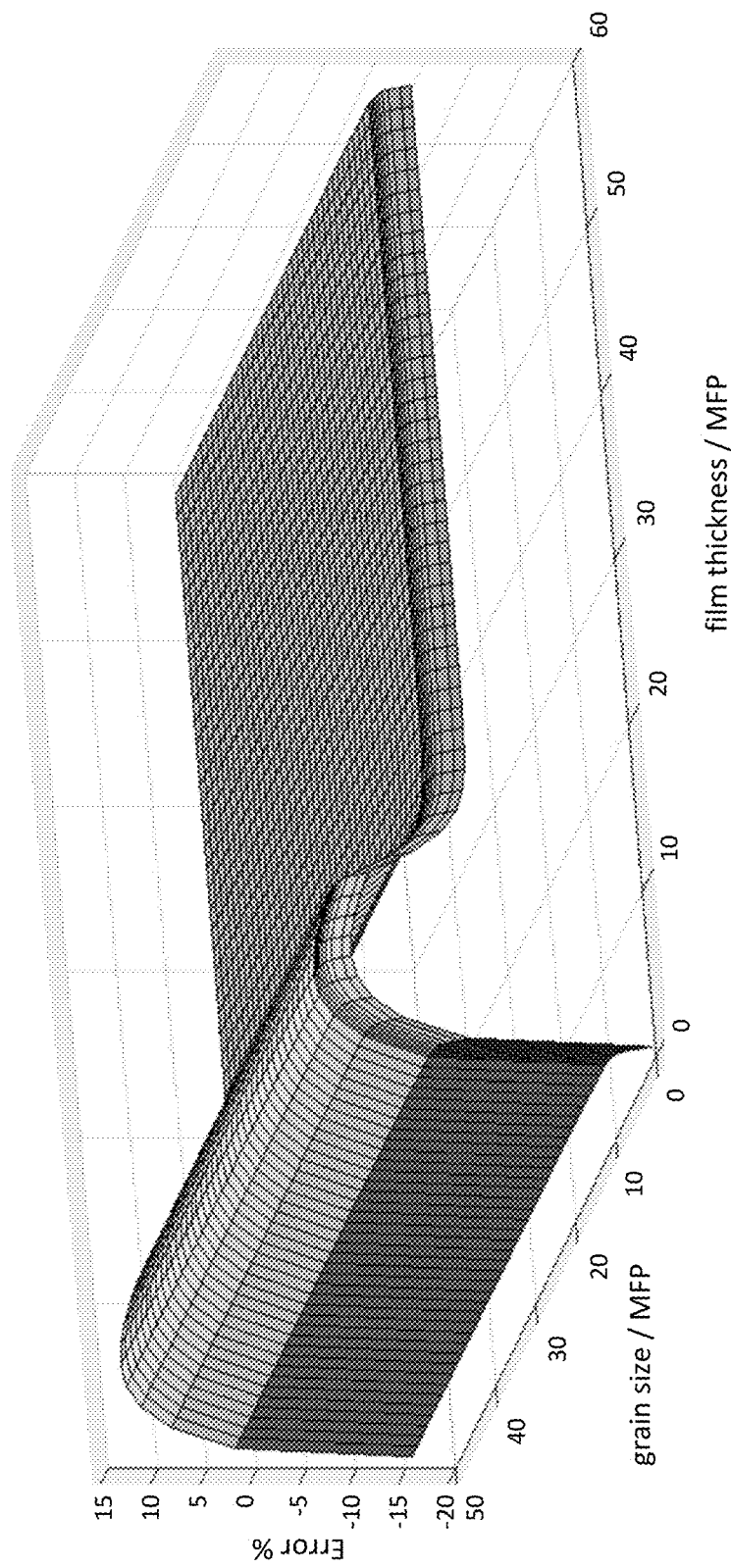
FIG. 6 is a 3D chart showing error percent versus grain size/MFP versus film thickness/MFP.
Figure 7:
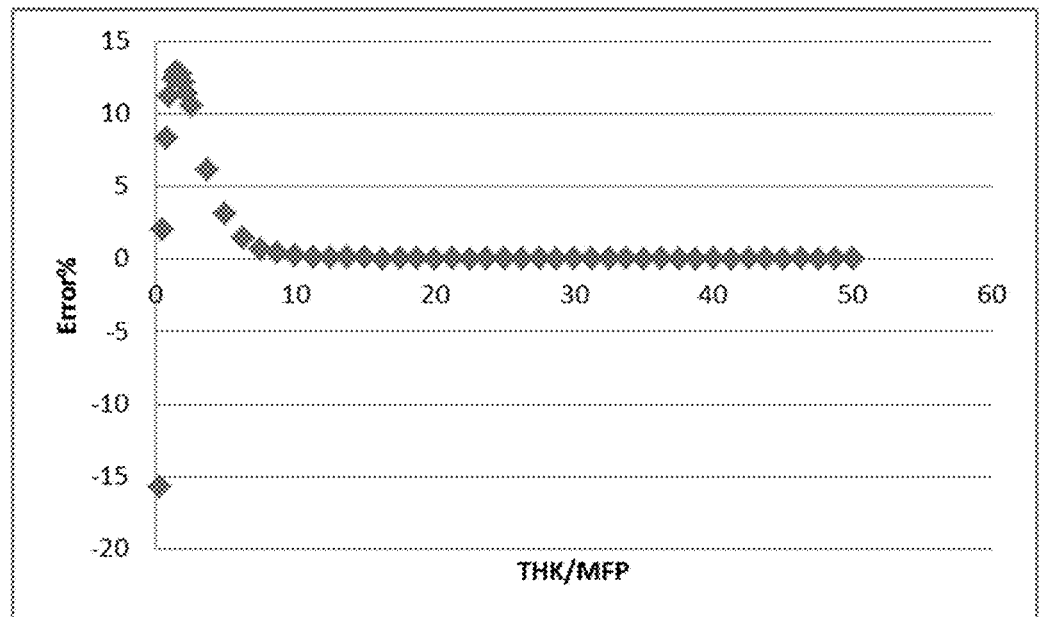
FIG. 7 is a chart showing error percent versus thickness/MFP.

As seen in FIGS. 6 and 7, a percent error of the linear assumption at different film thickness and grain size can be determined. For THK/MFP>10, the percent error is small enough to be ignored. For THK/MFP>10, the linear correlation is good enough to calibrate conductivity with TCR. For thinner films, a higher order correlation may be needed. Non-linear correlations also can be used.

Thus, if a TCR value of metal film is measured, the resistivity/conductivity of the metal film can be obtained based on a calibration curve. If the Rs value is known, film thickness can be derived from the Rs equation thickness (1/(Rs·$\sigma$)). This technique can be applied to metal films of various thicknesses.

Figure 13:
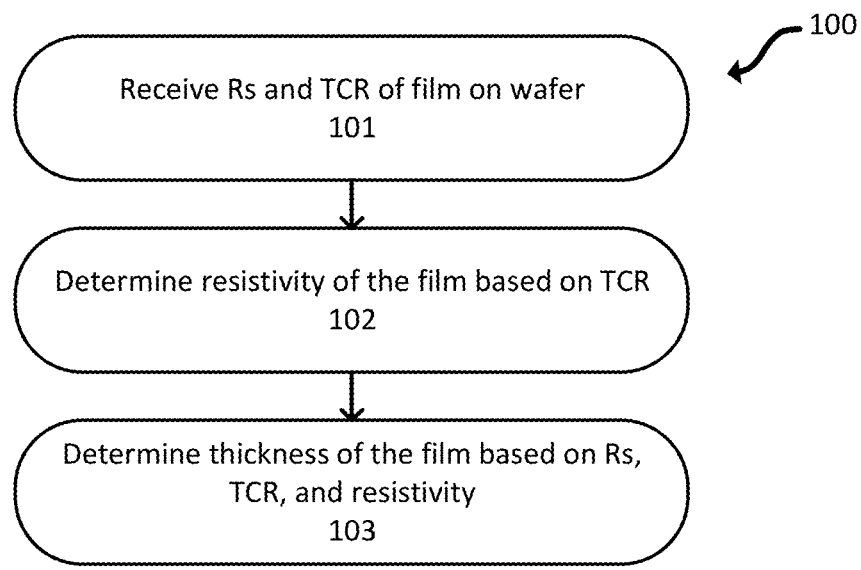
FIG. 13 is a flowchart of an embodiment of a method in accordance with the present disclosure.

A flowchart of a method to determine film thickness can be seen in FIG. 13. In the method 100, Rs and TCR for a film on a wafer are received 101, such as at a controller. For example, a four point probe can be used to obtain these Rs and TCR values. Other techniques can be used to calculate Rs and TCR, such as inductive measurement systems used to calculate Rs. A resistivity of the film is determined 102, such as using the controller, based on the TCR of the film. A correlation between the resistivity of the film and the TCR of the film can be used to determine the resistivity.

A thickness of the film is determined 103, such as using the controller, with the following equation.

$$THK = \left(\frac{1}{Rs}\right)\left(\frac{\gamma}{TCR}\right)$$

In the equation above, THK is a thickness, Rs is sheet resistance, $\gamma$ is the resistivity, and TCR is temperature coefficient of resistivity.

In an example, a thickness of a copper film is determined. Resistivity of the copper film is a function of grain size and film thickness. CMP will reduce the film thickness, driving the grain size out of equilibrium with the thickness. See the relationships in FIGS. 8 and 9.

Figure 8:
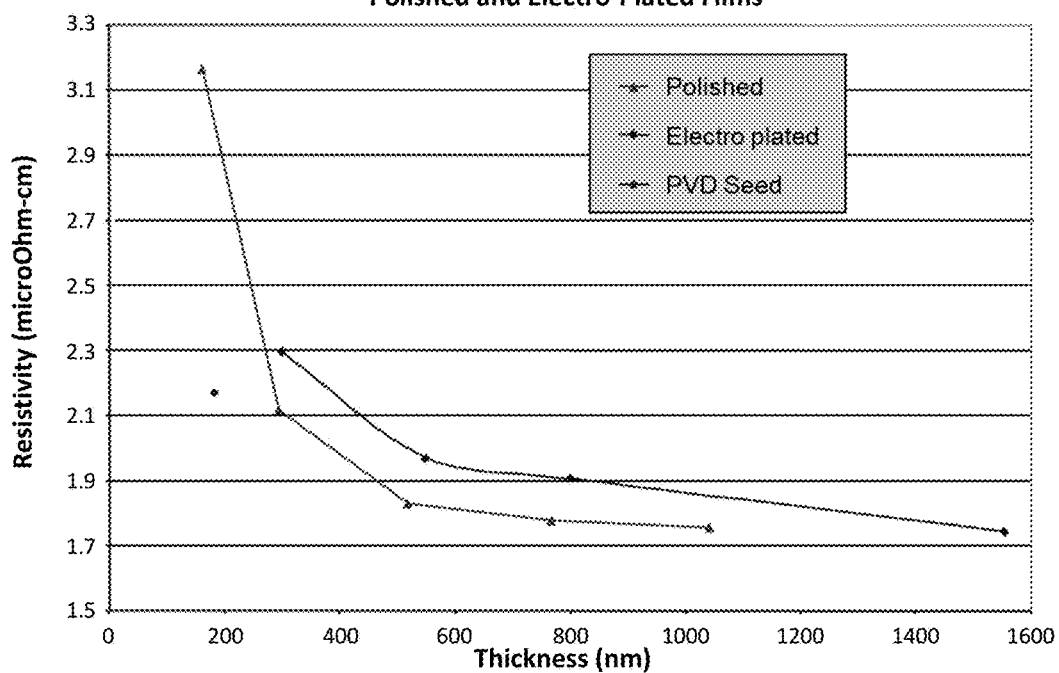
FIG. 8 is a chart showing resistivity versus thickness for exemplary polished and electroplated films.
Figure 9:
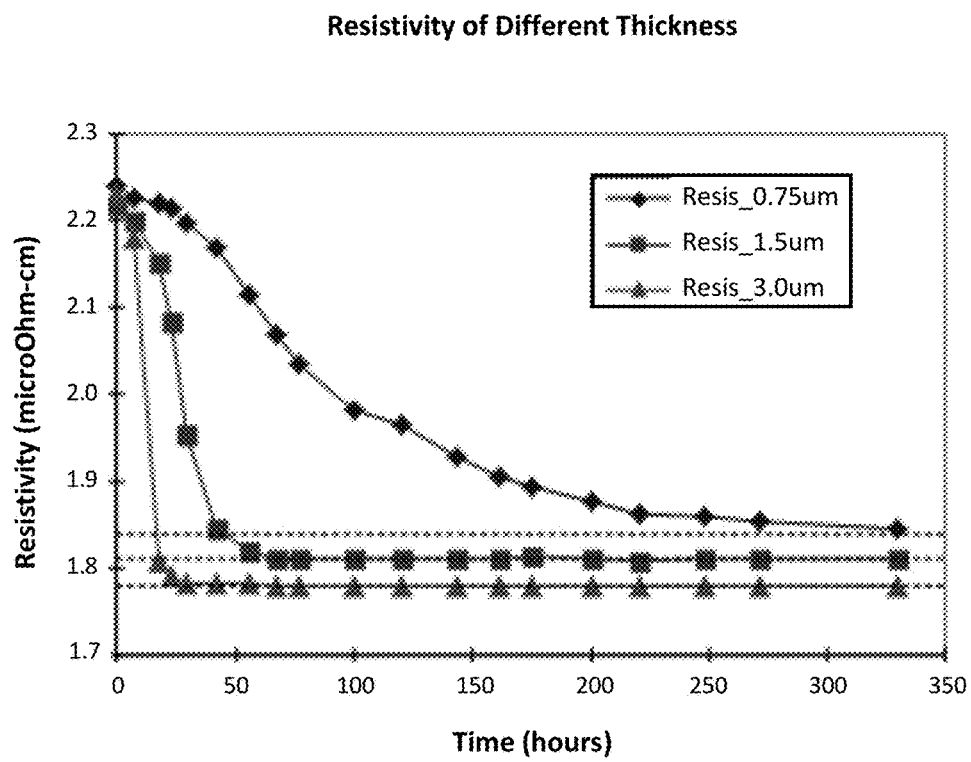
FIG. 9 is a chart showing resistivity versus time for exemplary films at various thicknesses.
Figure 10:
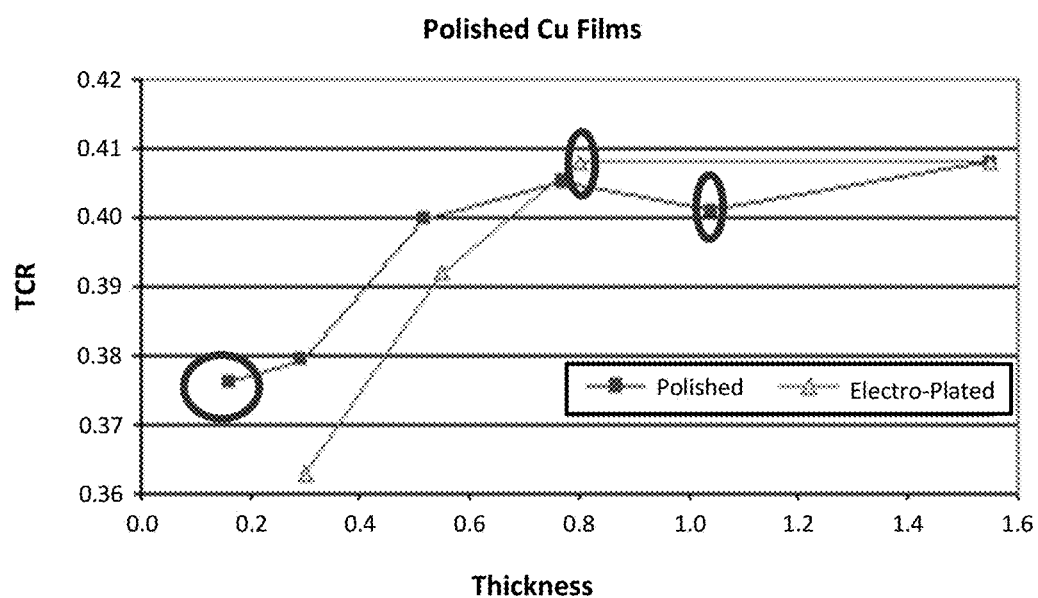
FIG. 10 is a chart showing TCR versus thickness for exemplary polished and electroplated films.

Copper films of different thicknesses and preparation methods were measured with a four point probe and alpha-step tool. The sheet resistance and thickness values were recorded as shown in FIG. 8. For this example, resistivity was affected by both thickness and grain size effects. The TCR value was measured as shown in FIG. 10.

Figure 11:
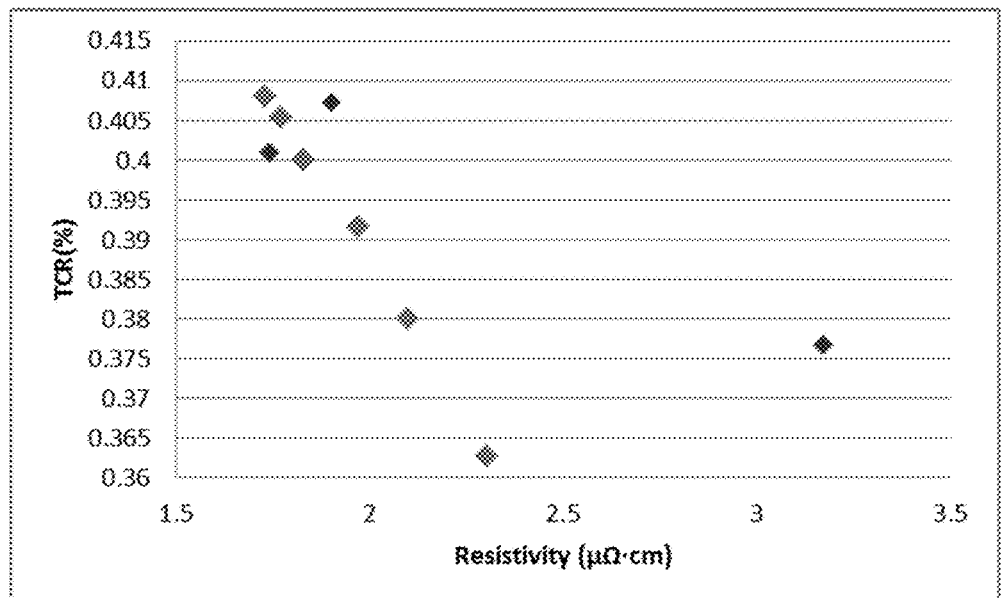
FIG. 11 is a chart showing TCR % versus resistivity for an exemplary copper film.

These data were plotted in resistivity and TCR space, as shown in FIG. 11. Three outlier points are denoted, which may come from measurement error.

Figure 12:
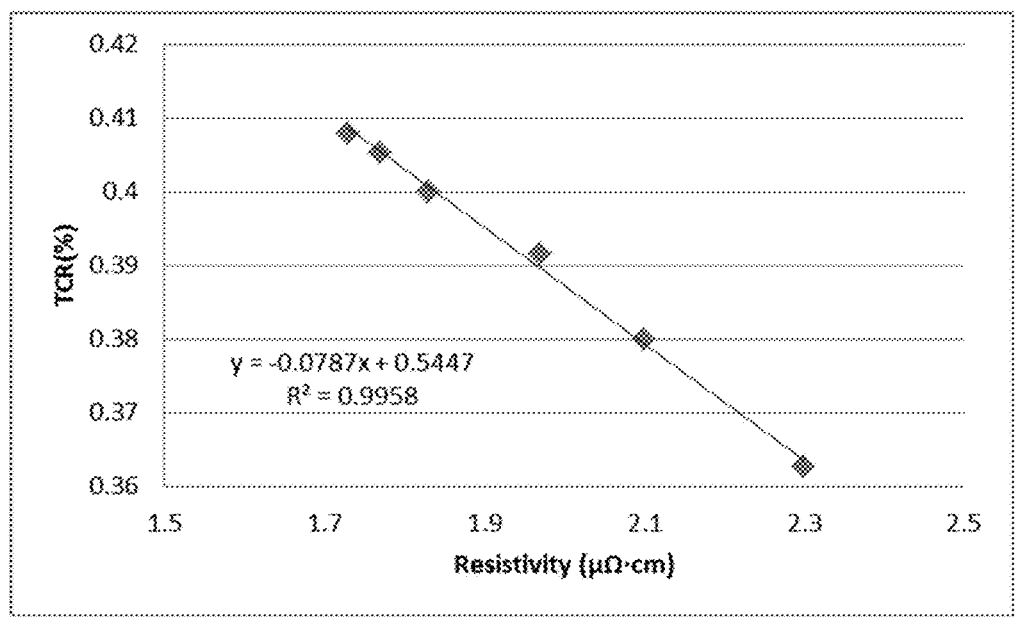
FIG. 12 is a chart showing TCR % versus resistivity for an exemplary copper film with outliers removed.

When these outliers are removed, as seen in FIG. 12, a linear correlation is obtained. With this correlation, film thickness can be determined based on Rs, $\gamma$, and TCR values. A non-linear correlation also is possible.

Figure 18:
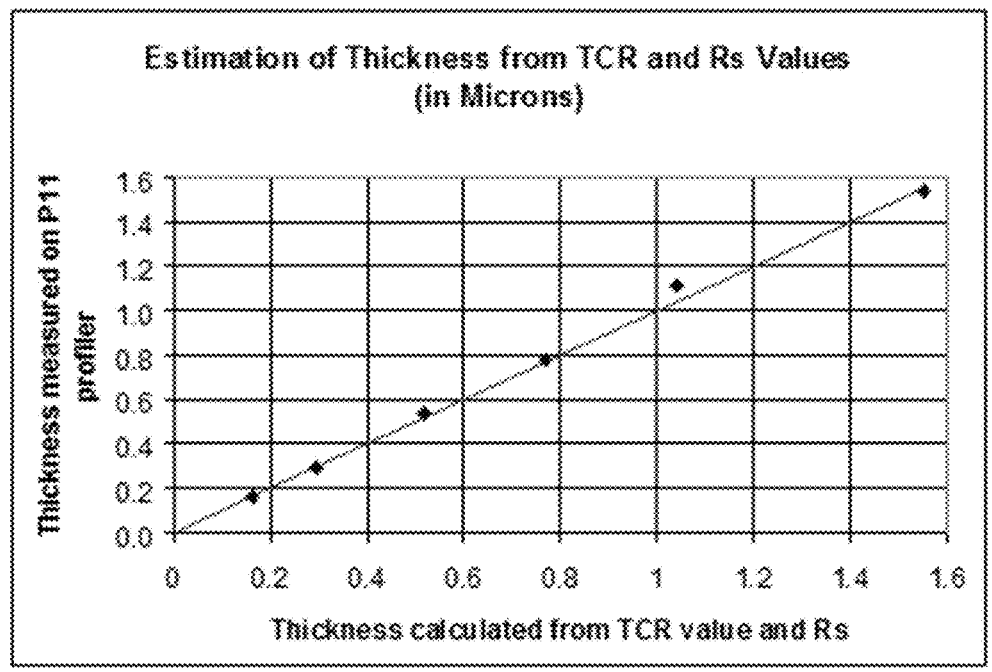
FIG. 18 is a chart comparing thickness calculated from TCR and Rs values and thickness measured on a P11 profiler.

FIG. 18 compares thickness measured from Rs and TCR values against thickness measured on a P11 profiler.

Both Rs and TCR can be measured using a metrology tool. Using the techniques disclosed herein, thickness and resistivity can be determined. The techniques disclosed herein may be applicable to all metals. Thus, thickness and resistivity of copper, aluminum, tungsten, gold, nickel, titanium, or zinc can be measured.

Figure 14:
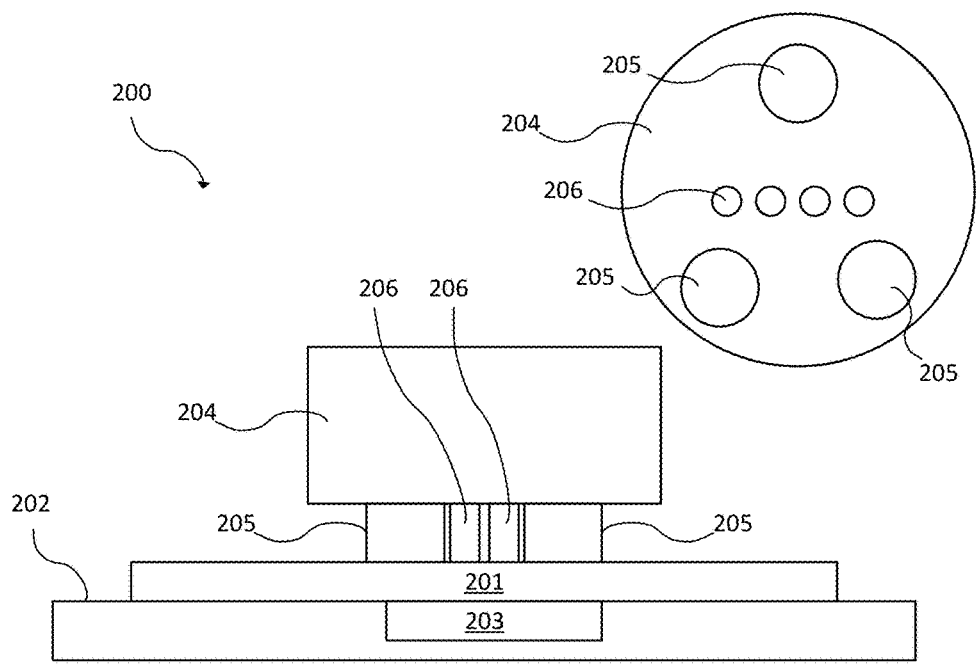
FIG. 14 is a block diagram of a first embodiment of a film thickness measurement device.

FIG. 14 is a block diagram of a first embodiment of a film thickness measurement device 200. A front cross-sectional view and corresponding bottom view of the probe head 204 are illustrated. The film thickness measurement device 200 of FIG. 14 may be used to achieve the TCR measurement on an entire wafer 201. The system includes a chuck 202 with heating element 203, which can heat the whole chuck 202 to desired temperature. While illustrated in the chuck 202, the heating element 203 can be external to or disposed on the outer surface of the chuck 202. In an instance, the heating element 203 can heat part of the chuck to different temperature values, and Rs is recorded with one or more temperature sensors 205, which can be located in the stop pads of the probe head 204. The temperature sensors 205 are positioned in the four point probe head 204 and can touch a surface of the wafer 201 during Rs measurement. The heating and measuring may occur at the same time.

While disclosed as touching the surface of the wafer 201 during Rs measurement, the temperature sensors 205 also may not contact the surface of the wafer 201 to make a measurement, such as by using infrared sensors as the temperature sensors 205.

During TCR measurement, the chuck 202 is heated to and kept stable at different temperature (T1) as defined in a recipe. When the temperature is stable, the probe head 204 will approach down and touch the surface of the wafer 201, making an Rs measurement (RS1) with the four point probes 206 and recording wafer temperature (T1') with the temperature sensors 205. After all sites are measured, the chuck 202 is heated to another temperature (T2) and Rs2 and T2' are recorded. Finally nX Rs (Rsl, Rs2 . . . Rsn) and wafer temperature (T1', T2' . . . Tn') values are recorded for every site. Thus, TCR values can be obtained at every site on the wafer 201. Measurements may be made between, for example, 49-121 sites, though measurements may be made at more than 1,000 sites.

In an instance, the entire chuck 202 is heated with the heating element 203.

In yet another instance, the chuck 202 includes multiple heating elements 203 in locations around the chuck 202, either inside and/or outside the chuck 202. One or more heating elements 203 are activated to heat part of the wafer 201.

Figure 15:
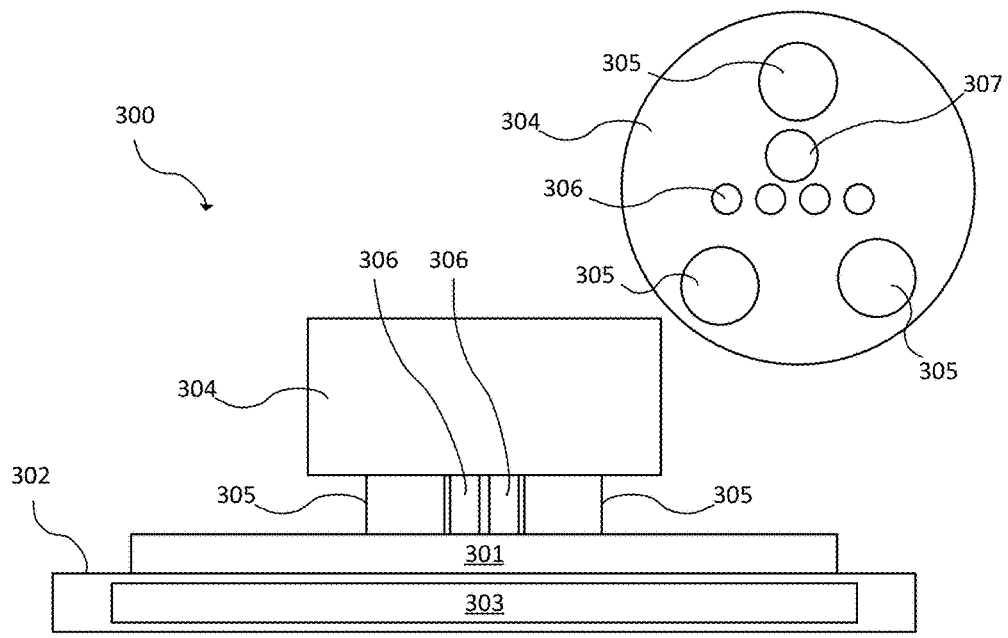
FIG. 15 is a block diagram of a second embodiment of a film thickness measurement device.

FIG. 15 is a block diagram of a second embodiment of a film thickness measurement device 300. A front cross-sectional view and corresponding bottom view of the probe head 304 are illustrated. In this embodiment, the probe head includes a localized heat source 307 that heats a region of the wafer 301. The heat source 307 may be, for example, a flash lamp or laser. The flash lamp or laser may have a power or use a wavelength configured to heat the wafer 301. The heat source 307 may be place coincident with, surrounding, or otherwise proximate the center two probes 306. The chuck 302 is actively cooled with cooling device 303 to dissipate heat and to reduce potential heat buildup that could affect neighboring sites on the wafer 301. While illustrated in the chuck 302, the cooling device 303 may be external to or on the outer surface of the chuck 302. While one cooling device 303 is illustrated, more than one cooling device 303 may be used. The temperature sensors 305 and four point probes 306 are used to make measurements of the wafer 301.

Figure 16:
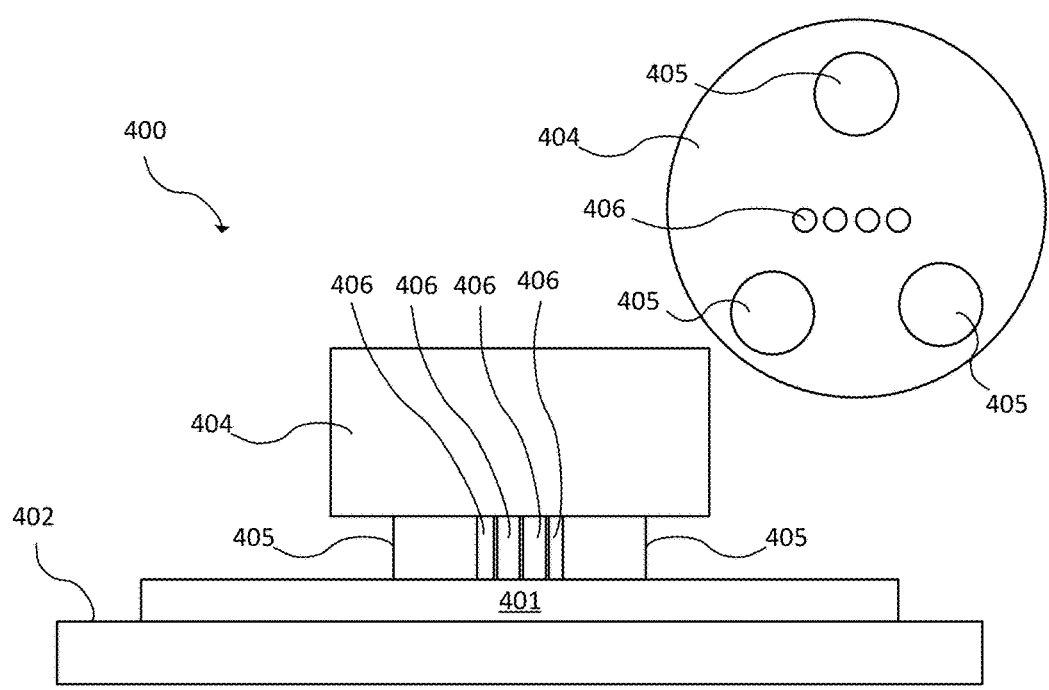
FIG. 16 is a block diagram of a third embodiment of a film thickness measurement device.

FIG. 16 is a block diagram of a third embodiment of a film thickness measurement device 400. The probe head 404 includes multiple probes 406. While four probes 406 are illustrated, more than four probes 406 may be included. For example, the probe head 404 may include ten or twelve probes 406.

Each of the probes 406 may be a whisker of material coated with a metal. For example, the material may be silicon, silicon oxide, or a combination thereof. The whiskers may have a thickness from 0.5 μm to 0.75 μm.

The probes 406 may be spaced from one another by less than 1 μm to 1 mm, including all values to the 0.1 μm and ranges between. The probes 406 and temperature sensors 405 are used to make measurements of the wafer 401 on the chuck 402.

Figure 17:
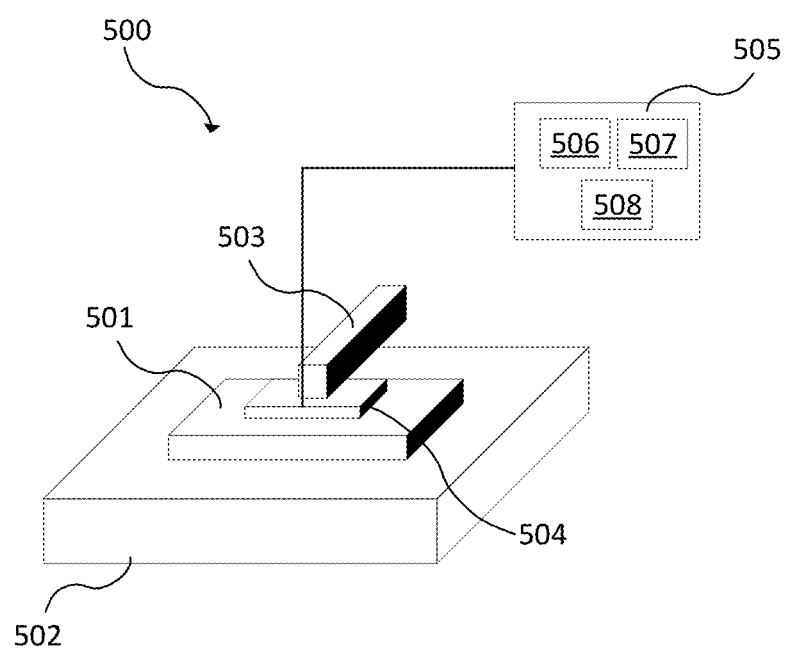
FIG. 17 is a block diagram of an embodiment of a film thickness measurement system in accordance with the present disclosure.

FIG. 17 is a block diagram of an embodiment of a film thickness measurement system 500. A controller 505 is in electronic communication with a probe head 504. The probe head 504 may be one of those illustrated in FIGS. 14-16 or other designs.

The system 500 includes a chuck 502 configured to hold a wafer 501 or other workpiece. The chuck 502 and/or probe head 504 may be configured to move or rotate in one, two, or three axes. For example, an actuator 503 may be used to move or rotate the probe head 504 in three axes. The chuck 502 may be heated or cooled.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. For example, a Cu metal film may be included on the wafer. Many different types of devices may be formed on a wafer, and the term wafer as used herein is intended to encompass a wafer on which any type of device known in the art is being fabricated.

Parts of the system 500 can communicate with the controller 505. For example, the controller 505 can communicate with the probe head 504 or other components of the system 500. The controller 505 can include a processor 506, an electronic data storage unit 507 in electronic communication with the processor 506, and a communication port 508 in electronic communication with the processor 506 and electronic data storage unit 507. It is to be appreciated that the controller 505 may be implemented in practice by any combination of hardware, software, and firmware. Also, its functions as described herein may be performed by one unit, or divided up among different components, each of which may be implemented in turn by any combination of hardware, software, and firmware. Program code or instructions for the controller 505 to implement the various methods and functions described herein may be stored in controller readable storage media, such as a memory in the electronic data storage unit 507, within the controller 505, external to the controller 505, or combinations thereof.

The controller 505 may be coupled to the components of the system 500 in any suitable manner (e.g., via one or more transmission media, which may include "wired" and/or "wireless" transmission media) such that the controller 505 can receive the output generated by the defect review system 500, such as output from the probe head 504. The controller 505 may be configured to perform a number of functions using the output. For instance, the controller 505 may be configured to determine the thickness of a film on the wafer 501 using the output. In another example, the controller 505 may be configured to send the output to an electronic data storage unit 507 or another storage medium without performing actions on the output. The controller 505 may be further configured as described herein, such as to perform the embodiments of FIG. 13. The controller 505 also may be configured to send instructions to a review, inspection, or metrology tool for sampling, imaging, inspection, or metrology purposes.

The controller 505, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

Program instructions implementing methods such as those described herein may be stored on computer-readable medium, such as in the electronic data storage unit 507 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Controller 505 may be configured according to any of the embodiments described herein. For example, the controller 505 may be programmed to perform some or all of the steps of FIG. 13.

An additional embodiment relates to a non-transitory computer-readable medium storing program instructions executable on a controller for performing a computer-implemented method for determining a thickness of a metal film, as disclosed herein. In particular, as shown in FIG. 17, electronic data storage unit 507 or other storage medium may contain non-transitory computer-readable medium that includes program instructions executable on the controller 505. The computer-implemented method may include any step(s) of any method(s) described herein.

In an instance, a non-transitory computer-readable storage medium comprises one or more programs for executing the following steps on one or more computing devices. A sheet resistance and a temperature coefficient of resistivity of a film on a wafer are received, such as at a controller. A resistivity of the film is determined based on the temperature coefficient of resistivity of the film using a correlation between the resistivity of the film and the temperature coefficient of resistivity of the film. A thickness of the film can be determined with the following equation.

$$THK = \left(\frac{1}{Rs}\right)\left(\frac{\gamma}{TCR}\right)$$

In the equation above, THK is a thickness, Rs is sheet resistance, y is the resistivity, and TCR is temperature coefficient of resistivity.

While disclosed as part of a system to determine film thickness, the controller 505 described herein may be configured for use with other systems. In another embodiment, the controller 505 described herein may be configured for use with a metrology system. Thus, the embodiments as disclosed herein describe some configurations for classification that can be tailored in a number of manners for systems having different imaging capabilities that are more or less suitable for different applications.

Each of the steps of the method may be performed as described further herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a probe head including:
      a plurality of stop pads;
      at least four probes configured to measure sheet resistance of a wafer, wherein the probes are whiskers of a material coated with a metal, wherein the probes are each spaced apart from less than 1 µm to 1 mm, and wherein the material is silicon, silicon oxide, or a combination thereof;
      a heat source disposed on the probe head, wherein the heat source is a flash lamp or a laser, and wherein the heat source is configured to heat a region of the wafer;
      a temperature sensor disposed on the probe head, wherein the temperature sensor is configured to measure a temperature of a wafer surface during a sheet resistance measurement; and
   a controller in electronic communication with the probes and the temperature sensor, wherein the controller receives the sheet resistance of the wafer and the temperature of the wafer from the probe head.

2. The system of claim 1, further comprising a chuck configured to hold the wafer and a heating element configured to heat the chuck.

3. The system of claim 1, further comprising an actuator connected to the probe head, wherein the actuator is configured to move the probe head relative to the wafer.

4. The system of claim 1, further comprising a chuck configured to hold the wafer, wherein the chuck includes a cooling element configured to cool at least part of a surface of the chuck.

5. The system of claim 1, wherein the probe head includes at least twelve of the probes.

6. The system of claim 1, wherein the temperature sensor is disposed on one of the stop pads, and wherein the temperature sensor is configured to contact a wafer surface during a sheet resistance measurement.

\* \* \* \* \*